(12) United States Patent  (10) Patent No.: US 8,568,023 B2
Tanaka  (45) Date of Patent: Oct. 29, 2013

(54) EAR THERMOMETER AND MEASURING APPARATUS USED WITH IT

(75) Inventor: Hideki Tanaka, Sapporo (JP)

(73) Assignee: Bio Echo Net inc, Sapporo-shi (JP)

( * ) Notice: Subject to any disclaimer, the term of this patent is extended or adjusted under 35 U.S.C. 154(b) by 0 days.

(21) Appl. No.: 13/479,755

(22) Filed: May 24, 2012

(65) Prior Publication Data

US 2012/0257649 A1  Oct. 11, 2012

Related U.S. Application Data

(62) Division of application No. 12/663,838, filed on Dec. 9, 2009, now Pat. No. 8,267,577.

(30) Foreign Application Priority Data

Jun. 12, 2007  (JP) .................................. 2007-004398
Jun. 11, 2008  (JP) .................................. 2008-153342
Jun. 12, 2008  (WO) ................... PCT/JP2008/060784

(51) Int. Cl.
*G01K 15/00*  (2006.01)
*G01K 7/00*  (2006.01)
*G01J 5/24*  (2006.01)

(52) U.S. Cl.
USPC ............... 374/121; 374/170; 374/1; 374/129; 374/172; 702/139; 702/99; 600/549; 600/474

(58) Field of Classification Search
USPC ............. 374/1, 170–173, 120, 121, 129, 178, 374/183–185; 702/130–136, 139, 99; 600/474, 549

See application file for complete search history.

(56) References Cited

U.S. PATENT DOCUMENTS

| | | | |
|---|---|---|---|
| 4,312,358 A * | 1/1982 | Barney ........................... | 600/483 |
| 4,536,851 A * | 8/1985 | Germanton et al. .......... | 702/131 |
| 5,199,436 A * | 4/1993 | Pompei et al. ................ | 600/474 |
| 6,195,581 B1 * | 2/2001 | Beerwerth et al. ........... | 600/474 |
| 6,837,618 B1 * | 1/2005 | Yamamoto et al. ........... | 374/163 |
| 7,376,023 B2 | 5/2008 | Umezawa | |
| 7,387,436 B2 | 6/2008 | Tanaka | |
| 8,013,745 B2 * | 9/2011 | Icove et al. ................. | 340/573.1 |
| 2003/0123517 A1 | 7/2003 | Nojiri | |
| 2004/0057494 A1 * | 3/2004 | Tsao et al. .................... | 374/121 |
| 2005/0043603 A1 * | 2/2005 | Ishler ............................ | 600/365 |
| 2005/0094705 A1 * | 5/2005 | Chi ............................... | 374/121 |
| 2007/0091980 A1 | 4/2007 | Tanaka | |
| 2007/0109876 A1 | 5/2007 | Umezawa | |
| 2007/0276283 A1 | 11/2007 | Hung | |
| 2008/0214949 A1 * | 9/2008 | Stivoric et al. ............... | 600/549 |

FOREIGN PATENT DOCUMENTS

| | | |
|---|---|---|
| CN | 1952633 A | 4/2007 |
| EP | 1324012 A2 | 7/2003 |
| EP | 1777504 A1 | 4/2007 |
| JP | 2505571 Y2 | 5/1996 |

(Continued)

*Primary Examiner* — Gail Verbitsky
(74) *Attorney, Agent, or Firm* — Marvin A. Motsenbocker; Mots Law, PLLC

(57) ABSTRACT

A measuring apparatus for an ear thermometer includes a battery, a mode switching circuit and a microcontroller, and the microcontroller, during a run mode or a normal operating state, does not pass battery current to the mode switching circuit in order that the insertion of the mode switching circuit causes no substantial change in power consumption so as to suppress a power consumption of the apparatus and extend the power of the battery.

5 Claims, 15 Drawing Sheets

(56) References Cited

FOREIGN PATENT DOCUMENTS

| | | |
|---|---|---|
| JP | 2003-194630 A | 7/2003 |
| JP | 2006-118992 A | 5/2006 |
| JP | 2006-250883 A | 9/2006 |
| JP | 2007-111363 A | 5/2007 |
| JP | 2007-133996 A | 5/2007 |

* cited by examiner

EAR THERMOMETER AND MEASURING APPARATUS USED WITH IT

CROSS REFERENCE TO RELATED APPLICATIONS

This application is a division of application Ser. No. 12/663,838 filed on Dec. 9, 2009, which is based upon and claims the benefit of priority based on 35 USC 119 from the prior Japanese Patent Application Nos. P2007-004398, filed on Jun. 12, 2007 and P2008-153342 filed on Jun. 11, 2008; the entire contents of both of which are incorporated herein by reference.

TECHNICAL FIELD

The present invention generally relates to a thermometer to measure the body temperature of a measuring object, and particularly, to an ear thermometer to measure a temperature of the eardrum by inserting a temperature sensing part into an ear hole and a measuring apparatus used with the ear thermometer.

BACKGROUND TECHNOLOGY

A typical example of a conventional ear thermometer will be explained with reference to FIGS. 15 and 16. FIG. 15 is a circuit block diagram illustrating an operation principle of the conventional ear thermometer and FIG. 16 is a vertical section of a temperature sensing part of the conventional ear thermometer. As illustrated in FIG. 15, a probe 10 of the typical conventional ear thermometer employs a thermopile 11. Generally, the thermopile produces a potential difference depending on a temperature difference between a cold junction and a hot junction (the Seebeck effect). Using the thermopile as a temperature measuring probe needs a room temperature (ambient temperature) compensation like a thermocouple. For this, the conventional ear thermometer employs a thermistor 12.

If the temperature of a measuring object is equal to a cold junction temperature of the thermopile 11, an output from the probe 10 is zero (zero point). On the other hand, if the temperature of the measuring object is higher than the cold junction temperature of the thermopile 11, an output from the probe 10 becomes nonlinearly larger.

When using the probe 10 to measure a body temperature, an output from the probe 10 is weak. Accordingly, the output from the probe 10 is amplified by a signal amplifier 13 to a signal processing possible level. A linearizer 14a linearizes a nonlinear output. An output from the thermistor 12 is also nonlinear, and therefore, is linearized by a linearizer 14b.

In a state in which an ambient temperature is stable, the temperature of the thermistor 12 and the cold junction temperature of the thermopile 11 are equal to each other. The signal formed by linearizing the output from the probe 10 indicates a difference between the temperature of the thermistor 12 and the temperature of the measuring object. Accordingly, the signal formed by linearizing the output from the probe 10 is corrected by an emissivity corrector 15, the corrected signal and the signal formed by linearizing the output from the thermistor 12 are compensated by an adder 16 for a room temperature or a cold junction temperature, and the compensated signal is compensated by a temperature converter 17 for an ambient temperature, thereby providing the temperature of the measuring object, which is displayed on a display 18.

The thermopile involves a large variation in sensitivity due to individual differences, and therefore, provides a different output voltage with respect to a given temperature difference. Accordingly, a probe employing the thermopile must carry out an individual sensitivity adjustment (calibration work). An infrared absorbing film of the thermopile (a part where the infrared absorbing film and hot junction are integrated, refer to 116 of FIG. 16) absorbs infrared rays from a measuring object and increases the temperature thereof. A package of the thermopile also radiates infrared rays to the infrared absorbing film. In normal use, the package is considered to have the same temperature as a heat sink (heat absorbing part) of the thermopile. If an external factor applies a sudden temperature change, a head of the package and the heat sink of the thermopile produce a temperature difference to transiently destabilize the output of the probe.

For this, as illustrated in FIG. 16, to make a temperature change be uniformly and gently applied to the probe 10, the thermopile 110 is arranged inside a metal (for example, aluminum) holder 111 having a good heat conductivity. In addition, there is arranged a cover 114 to surround the same with an air layer 112 and resin 113 serving as heat insulating materials. In front of the thermopile 110, there is arranged a metal pipe 115 to reduce the influence of heat radiation from the measuring object. The metal pipe 115 is plated with gold to reduce an emissivity and function as a waveguide. As a cold junction temperature compensating sensor, a semiconductor, a thermistor, or the like is employed. The thermistor is low in manufacturing cost and precise, and therefore, is generally used.

If thermal bonding between the thermopile cold junction and the thermistor is bad, a temperature difference occurs to prevent a correct measurement. The thermistor (not illustrated) and thermopile 110 are arranged in the same package, to improve thermal bonding between the heat sink of the thermopile cold junction and the thermistor. Even thermistors based on the same standard have different B-constants (the B-constant representing the magnitude of a resistance change obtained from temperatures at optional two points on a resistance-temperature characteristic curve), and therefore, it is difficult for the thermistor to keep accuracy for a wide range of ambient temperatures. For example, for a thermistor of an electronic thermometer used to measure the temperature of a human body in the range of 34 to 43° C., the thermistor is required to keep an accuracy only for the range of 8° C. If the thermopile must cover an ambient temperature range of 5 to 40° C., the thermistor must be accurate for the range of 35° C. (40−5=35).

According to the structure of the probe 10 illustrated in FIG. 16, an increasing ambient temperature produces a temperature difference between the thermopile 110 and a front end part of the probe 10, so that the temperature measuring part becomes to have a higher temperature than the thermopile 110, to cause a positive-direction error. A decreasing ambient temperature produces a temperature difference between the thermopile 110 and a front end part of the sensor, so that the temperature measuring part becomes to have a lower temperature than the thermopile 110, to cause a negative-direction error. To reduce the error, the thermopile 110 is surrounded with the cover 114 to reduce the influence of a temperature change. Enlarging the metal holder 111 is limited by the measuring object. To cope with the error caused by an ambient temperature change, a rate of change per unit time of the thermistor in the thermopile package is calculated to correct a probe output and reduce the error.

In connection with this, the applicant of the present invention has proposed in a preceding patent application (refer to Patent Document 1) an ear thermometer that eliminates the influence of an ambient temperature change of a short time and causes no error due to the ambient temperature change.

The ear thermometer according to Patent Document 1 has a probe that includes a first heat insulating member made of resin, a second high heat insulating member made of resin connected to a front end part of the first heat insulating member, a protection cover to cover the first heat insulating member and second high heat insulating member, a thermistor lead thin line embedded in the first heat insulating member and second high heat insulating member, and an ultrafast response thermistor arranged substantially at the center of a front return part of the thermistor lead thin line.

According to the invention of Patent Document 1, a temperature range in which the thermistor must keep accuracy is only a body temperature range of a measuring object. Unlike the conventional ear thermometer employing the thermopile, the thermistor is not required to keep a measuring accuracy for an entire measuring ambient temperature range. As a result, the probe according to the invention of the patent application is not influenced by a change in an ambient temperature (a temperature change of a short time).

The ear thermometer according to Patent Document 1, however, has problems of hardly being miniaturized, consuming large power, involving a complicated circuit, and partly needing expensive parts to increase a total cost.

The ear thermometer according to Patent Document 1 is appropriate for once measuring a body temperature in a short period of time, but it is inappropriate for continuously measuring body temperatures for a long period of time. Under a special using condition, for example, when measuring the body temperature of a patient during his/her surgery, a sufficient time is available in a preparatory stage before the surgery. Namely, if a warm-up time of certain extent (about 10 minutes) is allowed, if a large relative temperature and a quick temperature change are ignorable (if sensing a temperature change of 1° C. for 10 minutes at the maximum is sufficient), if continuous measurement is needed, and if ambient temperature is relatively stable, the ear thermometer according to Patent Document 1 is expensive and is inappropriate.

To obtain an ear thermometer that is capable of continuously measuring the temperature of a measuring object for a long period of time and is inexpensive and disposable, the applicant of the present invention has proposed in the succeeding patent application (refer to Patent Document 2) an ear thermometer having a measuring apparatus and a probe that is connected to the measuring apparatus and includes a probe body and a temperature measuring part joined with the probe body. The probe body is substantially formed in an L-shaped cylinder, a first end thereof is connected through a cable to the measuring apparatus, and a second end thereof is connected to the temperature measuring part. The temperature measuring part includes a flange joined with the probe body and a front end part extending from the flange. Inside the front end part, a sensor mirror is fitted. The sensor mirror includes a cylindrical holder with an internal concave reflection face, a joint shaft extending from the back of the cylindrical holder, a temperature measuring first sensor and a correcting second sensor supported with lead wires in a front space of the cylindrical holder, and a protection cover covering a front face of the cylindrical holder. The lead wires supporting the first and second sensors are passed through the temperature measuring part and probe body and are electrically connected to the cable.

In the ear thermometer according to Patent Document 2, a thermistor used for the probe must secure an accuracy only for a temperature range in which the body temperature of a measuring object varies. Unlike the conventional ear thermometer using a thermopile, the thermistor is not required to secure a measurement accuracy for a whole range of measurement ambient temperatures. Under a relatively stable ambient temperature, it is possible to achieve continuous measurement for a long period of time. With a simplified temperature measuring circuit, simplified temperature calibration, miniaturized probe, and simplified assembling work for mass production, this ear thermometer is compact and inexpensive. Accordingly, the ear thermometer according to Patent Document 2 is disposable, is stably and surely attachable to the ear of a measuring object, and is optimum for, in particular, measuring the body temperature of a patient during his/her surgery.

The ear thermometer according to Patent Document 2, however, is configured to support the first and second sensors with the lead wires in the sensor mirror, and therefore, the work to solder the sensors and lead wires together and the work to arrange the sensors in the sensor mirror need a high skill and a long time. Accordingly, this ear thermometer is unsuitable for mass production.

Conventional ear thermometers have the problem that their measuring apparatuses are large in scale, and therefore, it is required to reduce the sizes thereof.

Patent Document 1: Japanese Unexamined Patent Application Publication No. 2006-250883

Patent Document 2: Japanese Unexamined Patent Application Publication No. 2007-111363

DISCLOSURE OF INVENTION

An object of the present invention is to provide an ear thermometer that is based on the ear thermometer of Patent Document 2 and has sensors that are configured to be easily installed in a sensor mirror, so that the ear thermometer is easily mass-producible.

Another object of the present invention is to provide a measuring apparatus incorporating a microcontroller, to further miniaturize a conventional compact ear thermometer.

An ear thermometer according to an aspect of the present invention is an ear thermometer provided with a probe connected to a measuring apparatus. The probe includes a probe body and a temperature measuring part joined with the probe body. The probe body is substantially formed in an L-shaped cylinder, a first end thereof being connected through a cable to the measuring apparatus, a second end thereof being joined with the temperature measuring part. The temperature measuring part includes a flange coupled with the probe body and a front end part extending from the flange, the front end part incorporating a sensor mirror. The sensor mirror includes a cylindrical holder with an internal concave reflection face, a connection shaft extending from the back of the cylindrical holder, a flexible printed circuit board with a circuit conductor of predetermined pattern, stretched in a front space of the cylindrical holder, a temperature measuring first sensor and a correcting second sensor spaced by a predetermined distance from each other in a longitudinal direction of the board and soldered to the circuit conductor on the board, and a protection cover covering a front face of the cylindrical holder. The flexible printed circuit board is electrically connected, in the temperature measuring part, to a first end of the cable passing through the probe body.

According to the ear thermometer of the above-mentioned aspect, it is possible that a first projection and a second projection are formed substantially at opposing locations in a middle part of an outer circumferential face of the sensor mirror, and a first positioning hole and a second positioning hole are formed on a first end side of the flexible printed circuit board at locations corresponding to the first and second projections.

According to the ear thermometer of the above-mentioned aspect, it is possible that the first and second projections are engaged with the first and second positioning holes, to guide a second end side of the flexible printed circuit board along the outer circumferential face of the sensor mirror in the longitudinal direction and electrically connect, in the temperature measuring part, the second end side of the board to the first end of the cable passed through the probe body.

According to the ear thermometer of the above-mentioned aspect, it is possible that an infrared transmission hole is formed in a middle part of the flexible printed circuit board stretched in the front space of the cylindrical holder and the first sensor and second sensor are arranged on each side of the infrared transmission hole in the longitudinal direction of the board.

According to the ear thermometer of the above-mentioned aspect, it is possible that a heat sink conductor is arranged at a middle part on the first end side of the flexible printed circuit board stretched in the front space of the cylindrical holder.

A measuring apparatus for an ear thermometer according to another aspect of the present invention includes a common voltage line, a built-in battery serving as a power source, a connector to receive a connector of a probe, having a common voltage terminal connected to the common voltage line, a flash-type microcontroller to control a temperature sensor of the probe, receive a resistance value output signal corresponding to a measured temperature from the temperature sensor, convert the signal into a digital temperature value, and output the digital temperature value, the microcontroller having a test port, a program write port, and a common voltage port connected to the common voltage line, establishing a flash mode when a HIGH voltage higher than a first predetermined voltage is applied to the test port, to enable a program to be written through the write port, and establishing a run mode when a LOW voltage lower than the first predetermined voltage is applied to the test port, a voltage regulator having an input side connected to the common voltage line, to provide a constant reference voltage, and a mode switching circuit connected to the common voltage line, to apply the HIGH voltage to the test port of the microcontroller when a common voltage is higher than a second predetermined voltage, apply the LOW voltage to the test port of the microcontroller when the common voltage is lower than the second predetermined voltage, and bypass a leakage current passing from the common voltage line to the mode switching circuit toward an output of the voltage regulator so as to combine them together. The connector has the common voltage terminal, a battery power source terminal connected to the built-in battery, a program write terminal connected to the write port of the microcontroller, and a sensor connection terminal to receive the resistance value output signal corresponding to a measured temperature from the temperature sensor of the probe.

According to the measuring apparatus for an ear thermometer of the above-mentioned aspect, it is possible that the mode switching circuit consists of a pnp-type transistor having an emitter connected to the common voltage line, a collector connected to the test port, and a base connected through a bias resistor to the common voltage line, a first resistor interposed between the collector and the ground, to set a voltage of the collector as the HIGH voltage when the transistor is in a conductive state, and a second resistor interposed between the base of the transistor and the output of the regulator.

According to the measuring apparatus for an ear thermometer of the above-mentioned aspect, it is possible that the mode switching circuit is constituted by connecting two resistors in series between the common voltage line and the ground, connecting a plus input terminal of an operational amplifier operating as a comparator to a connection midpoint of the two resistors, connecting a minus terminal of the operational amplifier through another resistor to the output line of the regulator, and connecting an output terminal of the operational amplifier to the test port of the microcontroller, so that, when a voltage applied to the plus terminal of the operational amplifier is higher than an intermediate voltage between a battery voltage applied to the common voltage line and a program write voltage, the operational amplifier is put in a conductive state to output the common voltage of the common voltage line as the HIGH voltage to the test port, and when it is lower than the intermediate voltage, the operational amplifier is inverted into a nonconductive state.

According to the measuring apparatus for an ear thermometer of the above-mentioned aspect, it is possible that the mode switching circuit is constituted by arranging a CMOS inverter between the common voltage line and the ground, connecting a switching terminal of the CMOS inverter and the output of the regulator to each other through a resistor, and connecting an output of the CMOS inverter to the test port, so that, when a voltage applied to the switching terminal of the CMOS inverter is higher than an intermediate voltage between a battery voltage applied to the common voltage line and a program write voltage, the common voltage of the common voltage line is outputted as the HIGH voltage to the test port, and when it is lower than the intermediate voltage, an output voltage from the regulator stepped down through the resistor is outputted as the LOW voltage to the test port.

According to the measuring apparatus for an ear thermometer of the above-mentioned aspect, it is possible that the connector is configured so that, when connected to a probe connector, the battery power source terminal and common voltage terminal are connected to each other through short-circuited two terminals of the probe connector, and when connected to a program write unit connector, the common voltage terminal is connected to a voltage terminal of the second predetermined voltage of the program write unit connector.

According to the ear thermometer of the present invention, the sensor (thermistor) used for the probe is required to secure an accuracy only for a temperature range in which the body temperature of a measuring object varies. Unlike the conventional ear thermometer using a thermopile, the thermistor is not required to keep an accuracy for an entire measuring ambient temperature range. When an ambient temperature is relatively stable, it can carry out a continuous measurement for a long period of time. The sensor is soldered to the circuit conductor of the flexible printed circuit board, to simplify assembling work. This is advantageous for mass production. With the simplified temperature measuring circuit, simplified temperature calibration, and compact probe, the ear thermometer is small and inexpensive. The ear thermometer according to the present invention, therefore, is disposable and is stably and surely attachable to the ear of a measuring object. Accordingly, it is optimum for measuring, in particular, the body temperature of a measuring object during an operation.

According to the measuring apparatus for an ear thermometer of the present invention, the program write mode (flash mode) of the microcontroller incorporated in the measuring apparatus and the run mode to execute a written program are switched from one to another without using a mode switch of the microcontroller. Instead, the flash mode is established if a voltage applied to the test port of the microcontroller is HIGH, and if it is LOW, the run mode is established. Accordingly, only by preparing a program write unit that applies the HIGH voltage to the test port of the microcontroller and by connecting the program write unit to the connector of the measuring apparatus, the microcontroller is automatically shifted to the flash mode. As a result, the measuring apparatus for an ear thermometer according to the present invention needs no mode switch for the microcontroller, thereby simplifying a circuit configuration and miniaturizing the apparatus.

According to the measuring apparatus for an ear thermometer of the present invention, the mode switching circuit may employ the transistor. In this case, the first resistor is arranged between the common voltage line and the collector of the transistor, to set a voltage of the collector to the HIGH voltage when the transistor is in a conductive state. The second resistor is interposed between the base of the transistor and the output of the regulator, so that, when the transistor is OFF, a leakage current passes from the common voltage line through the first and second resistors to the output side of the regulator and combines with an output current of the regulator. This reduces an input current of the regulator itself by the leakage current in the run mode. As a result, the insertion of the mode switching circuit causes no substantial change in power consumption. This results in suppressing the power consumption of the apparatus and extending the power of the battery.

According to the measuring apparatus for an ear thermometer of the present invention, the mode switching circuit may employ the operational amplifier. In this case, the common voltage is set to a high voltage to invert the operational amplifier into a conductive state, so that the common voltage is outputted as the HIGH voltage to the test port of the microcontroller. When the common voltage is set to a low voltage, i.e., a battery voltage, the operational amplifier is again inverted into a nonconductive state so that the operational amplifier outputs the LOW voltage to the test port of the microcontroller. During the run mode of the microcontroller, which is a normal operating state of the microcontroller, no battery current is passed to the mode switching circuit. As a result, the insertion of the mode switching circuit causes no substantial change in power consumption. This results in suppressing the power consumption of the apparatus and extending the power of the battery.

According to the measuring apparatus for an ear thermometer of the present invention, the mode switching circuit may employ the CMOS inverter. In an operating state in which the CMOS inverter outputs the common voltage, the common voltage is supplied as the HIGH voltage to the test port of the microcontroller. When the CMOS inverter is inverted, the voltage of the regulator is set as the LOW voltage and is supplied to the test port of the microcontroller. In the run mode of the microcontroller, which is a normal operating state of the same, no battery current is passed to the mode switching circuit. As a result, the insertion of the mode switching circuit causes no substantial change in power consumption. This results in suppressing the power consumption of the apparatus and extending the power of the battery.

According to the measuring apparatus for an ear thermometer of the present invention, the probe connector is connected to the connector, so that the short-circuited two terminals of the probe connector connect the battery power source terminal and common voltage terminal to each other. The program write unit connector is connected to the connector, so that the voltage terminal of the second predetermined voltage of the program write unit connector is connected to the common voltage terminal. Depending on whether the connector is connected to the probe connector or the program write unit connector, there will be the normal run mode established by applying the battery voltage to the common voltage line or the program write mode established by applying the program write voltage to the common voltage line. Without letting an operator think of the mode switching, the microcontroller performs the mode switching operation.

BEST MODE OF IMPLEMENTING INVENTION

Embodiments of the present invention will be explained in detail with reference to the drawings.

Figure 1:
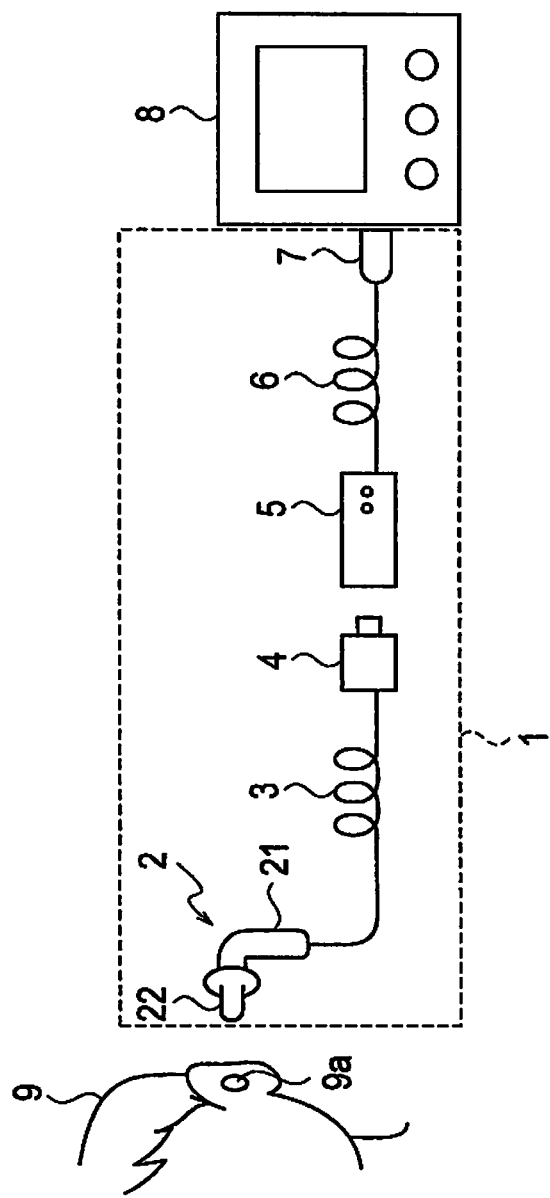
FIG. 1 A block diagram of an ear thermometer according to an embodiment of the present invention.
Figure 2:
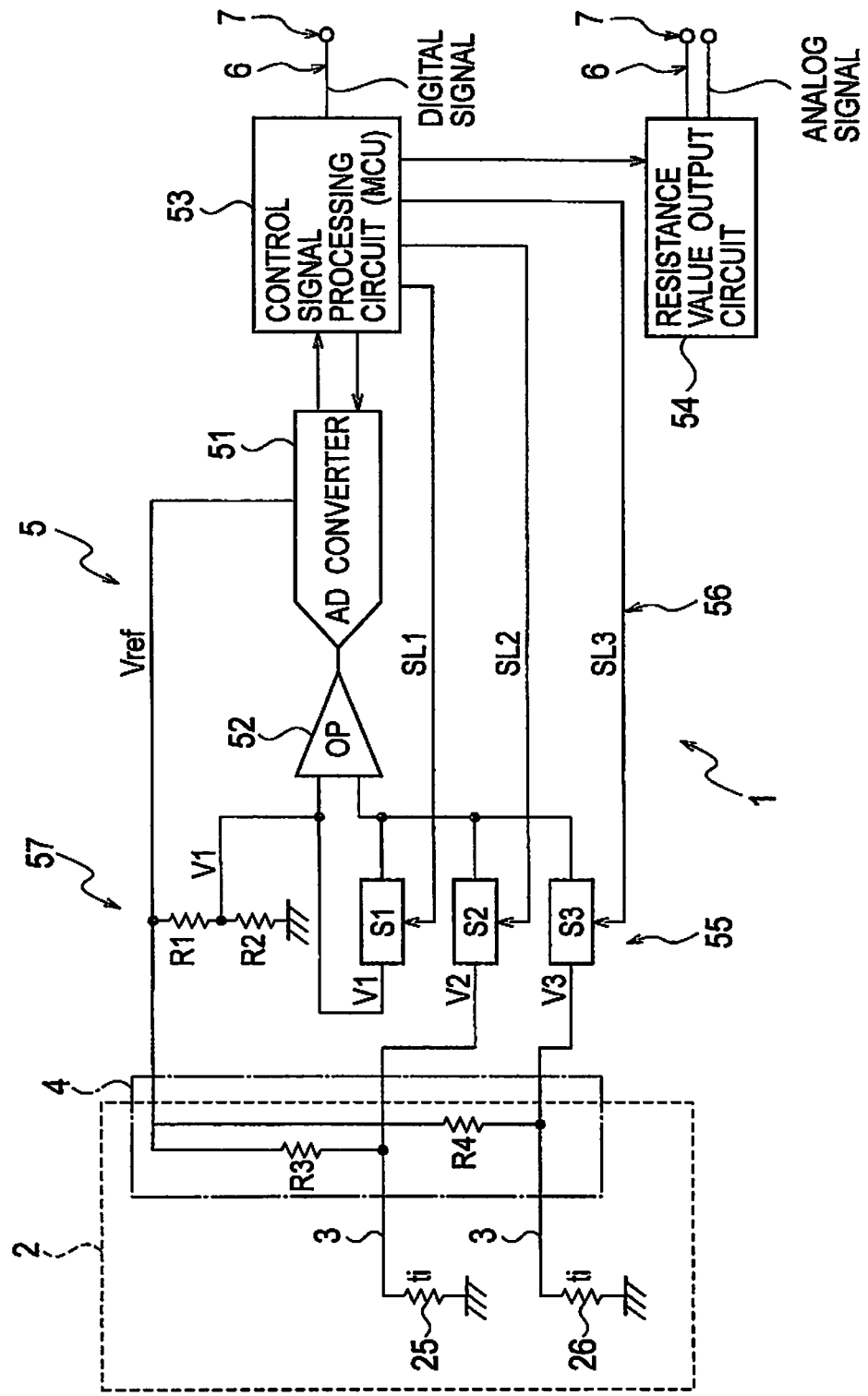
FIG. 2 A circuit block diagram of the ear thermometer of the embodiment.

FIG. 1 illustrates a device configuration of an ear thermometer according to an embodiment of the present invention and FIG. 2 illustrates a circuit configuration thereof. As illustrated in FIG. 1, the ear thermometer 1 according to this embodiment has a probe 2 that is inserted into an ear hole of an object person, to measure the temperature of an eardrum and output a resistance value representative of the measured temperature, a cable 3 to transmit a measurement signal of the probe 2 and supply power to the probe 2, a male connector 4, a measuring apparatus 5 to perform a temperature measuring process and other control, a cable 6 connected to the measuring apparatus 5, and a female connector 7 connected to a front end of the cable 6. The female connector 7 connected to the cable 6 of the measuring apparatus 5 is connected to a monitor 8 to display a measured temperature.

As illustrated in FIG. 2, main components of the measuring apparatus 5 include an AD converter 51 to conduct an AD conversion on a resistance value corresponding to a measured temperature from the probe 2, a differential amplifier 52 to amplify a temperature measurement signal from the probe 2, a control signal processing circuit 53 to conduct digital computations, a resistance value output circuit 54 to again convert the measured temperature digital signal provided by the control signal processing circuit 53 into a temperature corresponding analog resistance value for the monitor 8, a switch group 55 (switches S1, S2, and S3), a switching line group 56 (SL1, SL2, and SL3), a resistor group 57 (R1, R2, R3, and R4), the cable 6, and the female connector 7.

In use, the probe 2 is connected through the cable 3 and male connector 4 to a connector 501 (refer to FIGS. 11 and 12) of the measuring apparatus 5. The probe 2 has a temperature measuring first sensor 25 and a correcting second sensor 26 to be explained later. The sensors 25 and 26 are made of thermistors. In FIG. 2, the resistors R3 and R4 are arranged in the probe 2. They may be arranged in the measuring apparatus 5. The male connector 4 is preferably a usual card edge connector. This card records individual information such as a calibration value.

The temperature measuring first sensor 25 and correcting second sensor 26 of the probe 2 send detection signals through the resistors R3 and R4 to the AD converter 51 and through the switches S2 and S3 to the differential amplifier 52.

The AD converter 51 is connected to the control signal processing circuit 53 and differential amplifier 52 and the control signal processing circuit 53 is connected to the resistance value output circuit 54. The control signal processing circuit 53 outputs a digital signal and the resistance value output circuit 54 outputs an analog signal. The control signal processing circuit 53 is connected through the switching line group 56 to the switch group 55. The switch group 55 is connected to the differential amplifier 52.

To easily detect weak temperature difference signals from the first sensor 25 and second sensor 26, it is preferable to provide the AD converter 51 with high precision and high resolution. The resistors R1, R2, R3, and R4 are high precision resistors. Vref is a reference voltage for the AD converter 51 and is a full scale value of an AD converted value.

As illustrated in FIGS. 3 to 8, the probe 2 according to the embodiment includes a probe body 21, a temperature measuring part 22 connected to the probe body 21, and a tab 23 arranged along an outer side of the probe body 21. The probe body 21 is formed in a cylindrical body bent into substantially an L-shape having a long part 211 and a short bent part 212. The long part 211 extends downward from the ear hole 9a of the object person 9 along the temple on the face of the object person. The short bent part 212 engages with a flange 221 to be explained later of the temperature measuring part 22. This substantial L-shape orients a front end part 222 of the temperature measuring part 22 toward the eardrum in the ear hole 9a of the object person 9, and when worn, prevents the probe body 21 from dropping off the auricle or from turning around the auricle. From a lower end of the probe body 21, the cable 3 extends to electrically connect a flexible printed circuit board 246 on which the first sensor 25 and second sensor 26 to be explained later are arranged to the male connector 4. The tab 23 makes it easy to attach and detach the probe 2 to and from the ear hole 9a of the object person 9.

The temperature measuring part 22 includes the flange 221 joined with the short bent part 212 of the probe body 21 and the front end part 222 extending from the flange 221. The flange 221 is formed to close the entrance of the ear hole 9a and the front end part 222 is formed to meet a complicated shape of the external auditory.

The probe body 21, temperature measuring part 22, tab 23, and sensor mirror 24 that constitute the probe 2 are made from heat insulating materials. The temperature measuring part 22 is preferably covered with elastomer or silicon rubber in consideration of an allergy of the object person 9.

Figure 3:
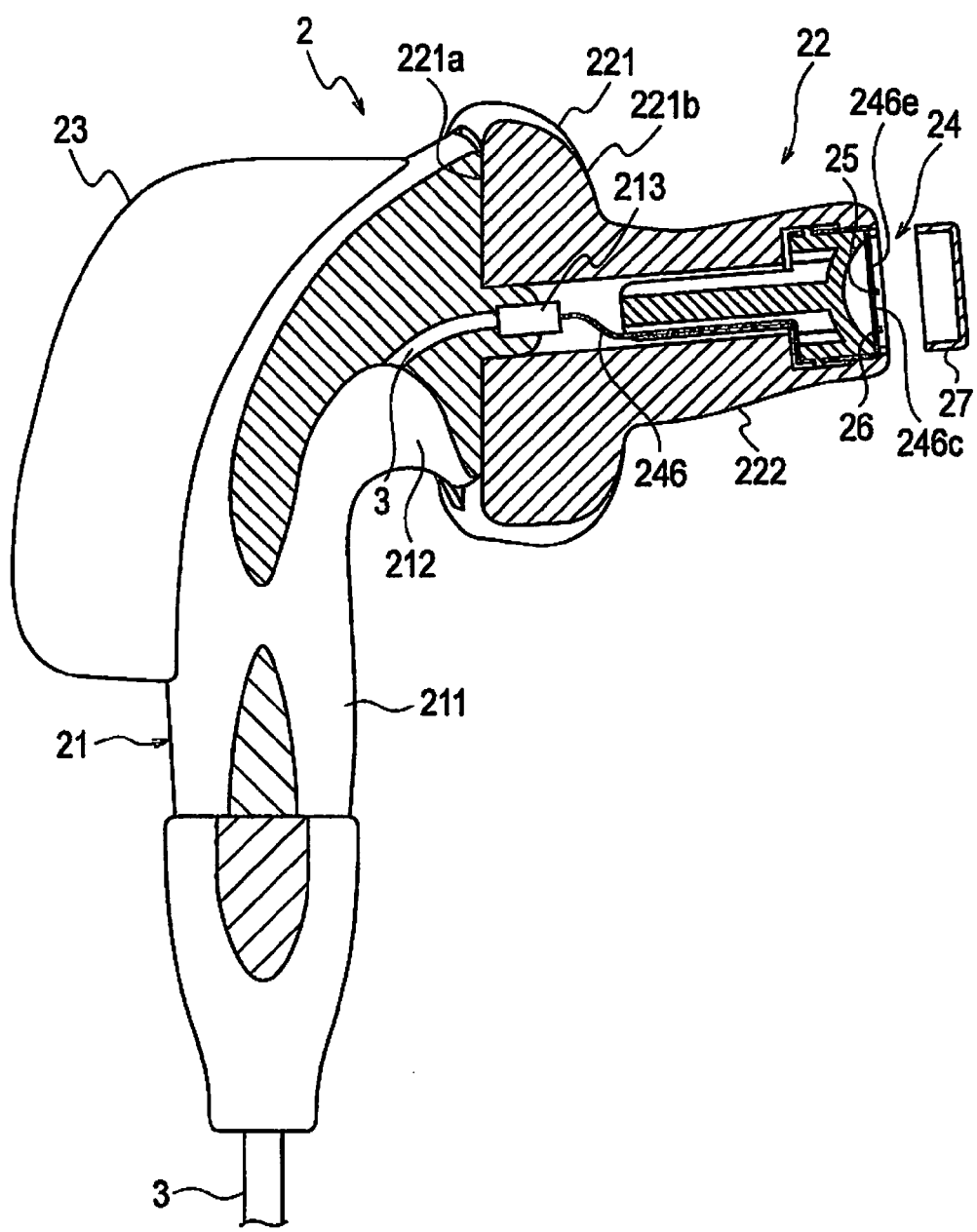
FIG. 3 A partly broken side view of a probe constituting the ear thermometer of the embodiment.

As mentioned above, the probe 2 of the ear thermometer 1 according to the embodiment includes the probe body 21, temperature measuring part 22, and tab 23. The temperature measuring part 22 includes the flange 221 and front end part 222. As illustrated in FIG. 3, the front end part 222 of the temperature measuring part 22 incorporates the sensor mirror 24. The sensor mirror 24 is any one of a parallel light condensing sensor mirror illustrated in FIG. 3 and a spot light source condensing sensor mirror illustrated in FIG. 4. The parallel light condensing sensor mirror condenses parallel light in front of a cylindrical holder into a sensor. The spot light source condensing sensor mirror condenses light from a spot light source at an assumed eardrum position. The sensor mirror 24 is a separate part from the temperature measuring part 22 so that the sensors 25 and 26 may easily be assembled.

Figure 4:
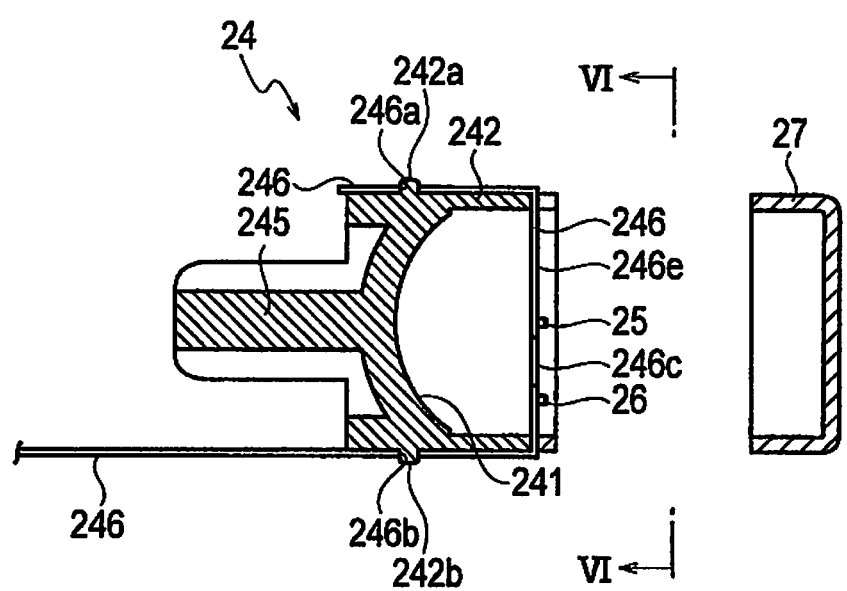
FIG. 4 A vertical sectional view of a sensor mirror constituting the probe in the ear thermometer of the embodiment.

The sensor mirror (spot light source condensing sensor mirror) 24 is made from an insulating material, and as illustrated in FIG. 4, includes the cylindrical holder 242 that is relatively long and incorporates a concave reflection face 241, a joint shaft 245 extending from the back of the holder 242, the flexible printed circuit board 246 to be explained later stretched in front of the holder 242, the temperature measuring first sensor 25 and correcting second sensor 26 to be explained later attached to the board 246, and a protection cover 27 covering a front face of the holder.

The reflection face 241 of the sensor mirror 24 preferably keeps a mirror-finished material surface, or is a metal (for example, aluminum) foil attached to the material surface, or is plated with nickel. The protection cover 27 is made of a material that suppresses a radiation energy loss and protects the sensors 25 and 26. For example, it is made of a polyethylene film of 0.015 mm in thickness. The protection cover 27 is pushed into a gap between an outer circumferential face of the cylindrical holder 242 and joint shaft 245 of the sensor mirror 24 and an inner circumferential face of the opening of the front end part 222 of the temperature measuring part 22 and is fixed thereto.

Figure 5:
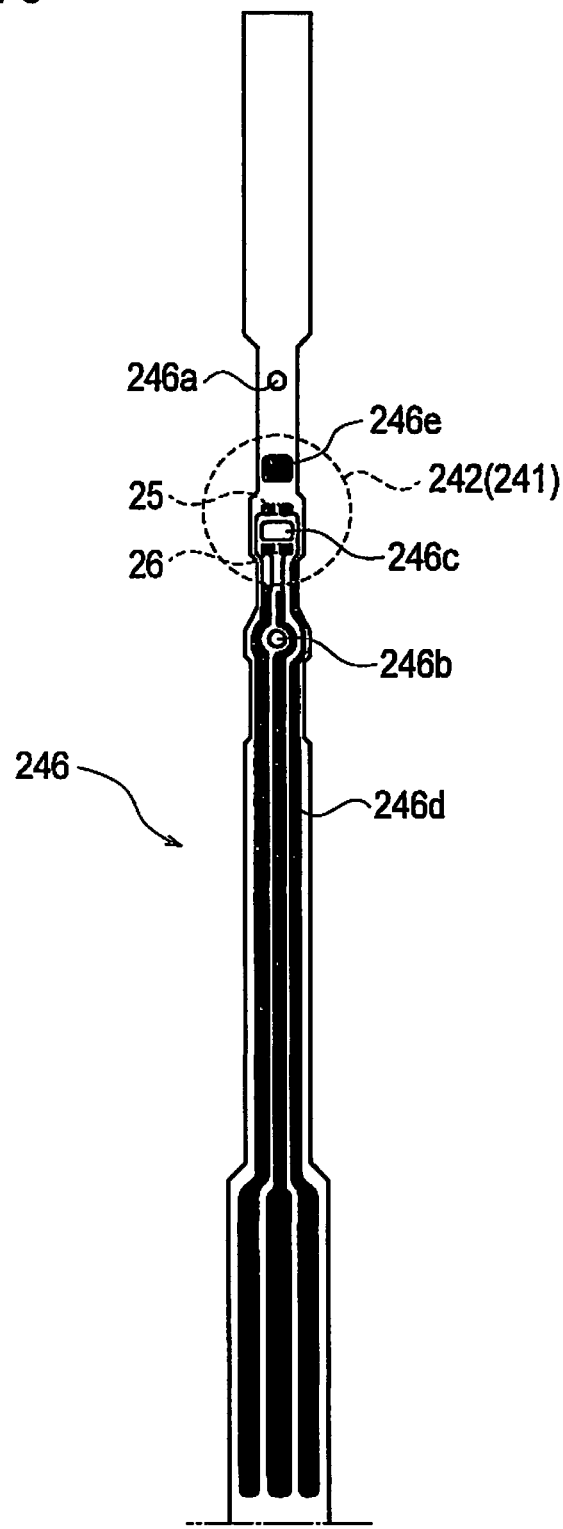
FIG. 5 A plan view of a flexible printed circuit board constituting the sensor mirror in the ear thermometer of the embodiment.
Figure 6:
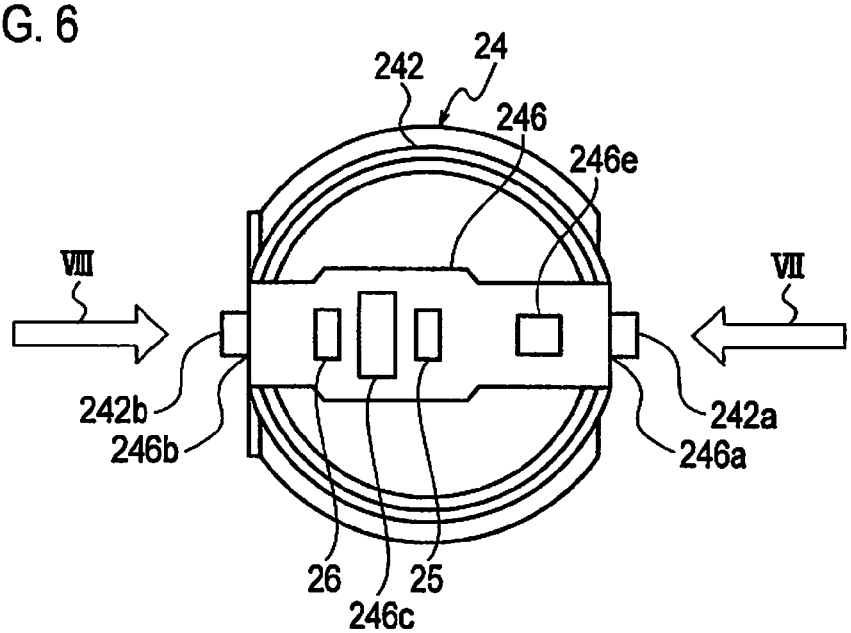
FIG. 6 A front view of the sensor mirror seen from a line VI-VI of FIG. 4.
Figure 7:
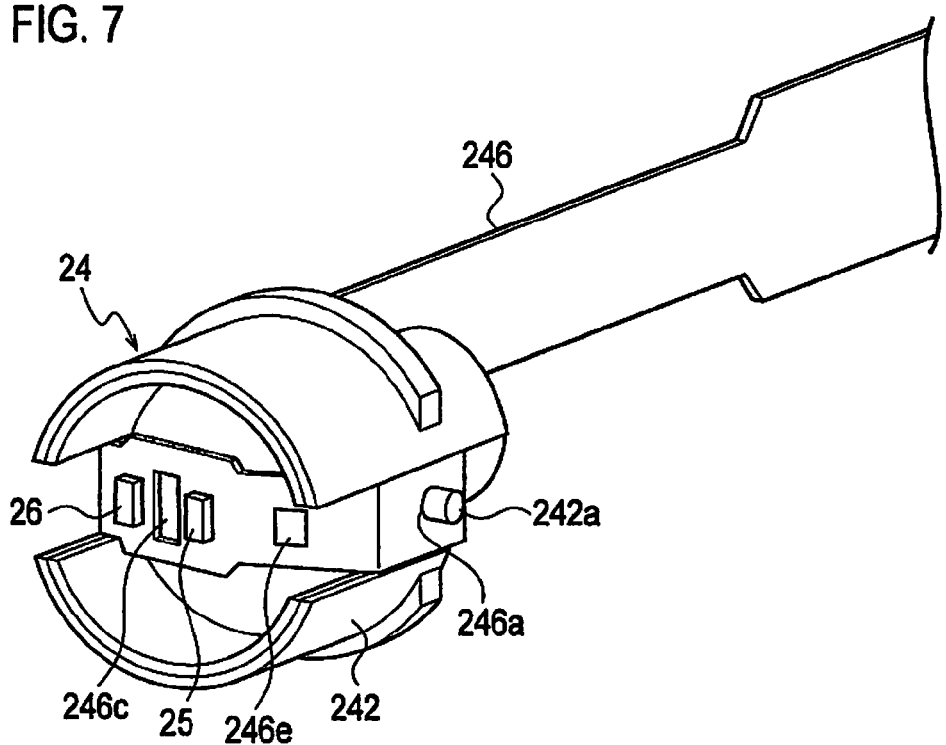
FIG. 7 A perspective view of the sensor mirror seen from the direction of an arrow VII of FIG. 6.
Figure 8:
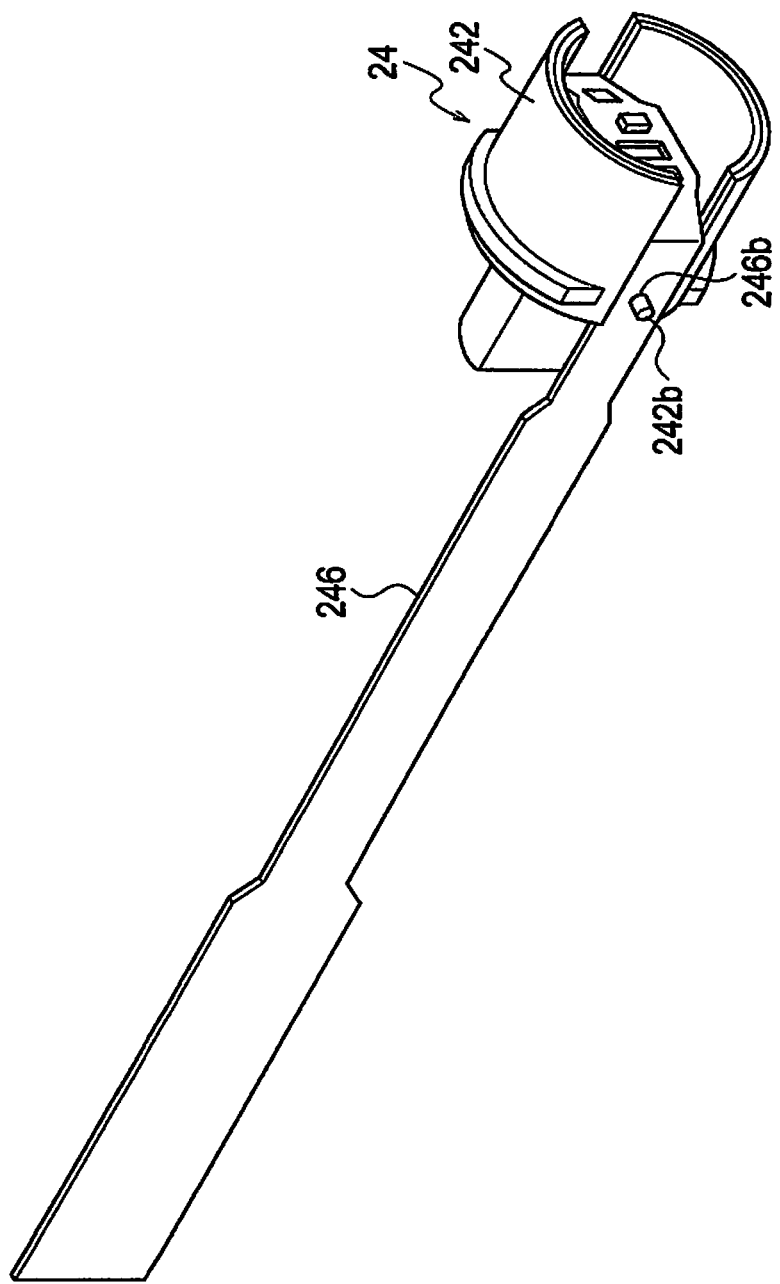
FIG. 8 A perspective view of the sensor mirror seen from the direction of an arrow VIII of FIG. 6.

As illustrated in FIG. 5, the flexible printed circuit board 246 is an elongated film made of flexible insulating material (for example, polyethylene) on which a circuit conductor 246d and a heat sink 246e are printed. In addition, it has an infrared transmission hole 246c, a first positioning hole 246a, and a second positioning hole 246b formed therethrough. Actions of them will be explained later.

As illustrated in FIGS. 4 and 6 to 8, a first projection 242a and second projection 242b are formed at opposing intermediate positions on the outer circumferential face of the cylindrical holder 242 of the sensor mirror 24. As illustrated in FIG. 5, the first positioning hole 246a and second positioning hole 246b are formed on a first end side of the flexible printed circuit board 246 at positions corresponding to the first projection 242a and second projection 242b. The first projection 242a and second projection 242b are fitted into the first positioning hole 246a and second positioning hole 246b, respectively. Consequently, the first end side of the flexible printed circuit board 246 is easily stretched in a front space of the cylindrical holder 242 of the sensor mirror 24.

A second end side of the flexible printed circuit board 246 is guided along the outer circumferential face of the cylindrical holder 242 in a longitudinal direction and is connected to a connection board 213 embedded in a front end of the probe body 21. As illustrated in FIG. 3, the second end of the flexible printed circuit board 246 on which the sensors 25 and 26 are arranged is connected through the connection board 213 to the front end of the cable 3. In this way, the flexible printed circuit board 246 is electrically connected, in the temperature measuring part 22, to the cable 3 passing through the inside of the probe body 21.

As illustrated in FIGS. 4 and 6 to 8, the first end side of the flexible printed circuit board 246 is stretched in the front space of the cylindrical holder 242. As illustrated in FIG. 5, the infrared transmission hole 246c is formed at an intermediate part of the flexible printed circuit board 246 that corresponds to an assumed location in the front space of the cylindrical holder 242 where the board is stretched. On each side of the infrared transmission hole 246c in a longitudinal direction of the board 246, the first sensor 25 and second sensor 26 are arranged. Before stretching the flexible printed circuit board 246 in the front space of the cylindrical holder 242, the sensors 25 and 26 are soldered to the circuit conductor 246d of the board 246. This allows the sensors 25 and 26 to easily be attached to the sensor mirror 24, and therefore, the temperature measuring part 22 becomes mass-producible without skills. Infrared rays from the object person 9 pass through the infrared transmission hole 246c of the board 246, are reflected by the reflection face 241 of the sensor mirror 24, and reach the sensors 25 and 26.

Also, as illustrated in FIG. 5, at an intermediate part of the flexible printed circuit board 246 that corresponds to the assumed location in the front space of the cylindrical holder 242 where the board is stretched, the heat sink conductor 246e is preferably arranged on the first end side of the board 246. The heat sink conductor 246e absorbs infrared rays that reach the board 246 and prevents a secondary thermal influence from acting on the sensors 25 and 26.

According to a reading test, it has been found that the reading of the probe 2 is influenced by an ambient temperature. For this, another sensor (second sensor 26) is arranged in addition to the temperature measuring sensor (first sensor 25), to correct the influence of an ambient temperature.

The first sensor 25 and second sensor 26 are preferably thermistor elements that have small thermal capacities, high thermal sensitivities, high infrared reactive temperature increases, and other characteristics.

According to tests, it has been confirmed that a temperature distribution having a highest condensing spot appears on the flexible printed circuit board 246 stretched in the front space of the cylindrical holder 242 of the sensor mirror 24. Accordingly, as illustrated in FIG. 4, the temperature measuring first sensor 25 is arranged substantially at a condensing point of the reflection face 241 of the sensor mirror 24. The ambient temperature correcting second sensor 26 is arranged at a position out of the condensing point. Since the sensors 25 and 26 are on the same board, they substantially simultaneously increase their temperatures, and therefore, a correction is easy. The first sensor 25 is coated with resin (for example, black-color thermosetting epoxy resin) that has a high emissivity (well absorbing infrared rays and generating heat) and easily radiates heat generated by infrared rays. The second sensor 26 is coated with resin (for example, two-component setting epoxy resin) that hardly absorbs infrared rays.

The first sensor 25 and second sensor 26 are simultaneously calibrated for temperatures. For the temperature calibration, the measuring apparatus 5 illustrated in FIG. 2 is used to measure a body temperature of the object person 9. First, the probe connector 4 is connected to the measuring apparatus 5 and the temperature plug 7 is connected to the monitor 8.

a) Offset Calibration

In the switch group 55, the switch S1 is set to ON and the switches S2 and S3 to OFF. An AD conversion is carried out to find an offset value. Since the resistors R1 and R2 are known, an AD input value is known. A difference between the AD converted value and the AD input value is an offset error of the differential amplifier 52 and AD converter 51. An AD converter input V1 at the time of offset calibration is expressed as $R2/(R1+R2) \times Vref$. In the case of a high precision AD converter, a self-calibration is carried out at each measurement, and therefore, the offset error of the AD converter is ignorable. Accordingly, the offset error is substantially from the differential amplifier 52.

b) Measurement of First Sensor 25

The switch S2 is set to ON and the switches S1 and S3 to OFF. An AD conversion is carried out to find an AD converted value. An AD conversion input V2 at the time of measurement of the first sensor 25 is expressed as $R3/(R3+RTh1) \times Vref$, where RTh1 is a resistance value of the first sensor 25 at an arbitrary temperature.

c) Measurement of Second Sensor 26

The switch S3 is set to ON and the switches S1 and S2 to OFF. An AD conversion is carried out to find an AD converted value. An AD conversion input V3 at the time of measurement of the second sensor 26 is expressed as $R4/(R4+RTh2) \times Vref$, where RTh2 is a resistance value of the second sensor 26 at an arbitrary temperature.

d) Difference Between Ad Converted Values of First Sensor 25 and Second Sensor 26

From the AD converted value of the first sensor 25, the offset value found by the offset calibration is subtracted. From a relationship of this value and a difference between the AD converted values of the first sensor 25 and second sensor 26, the temperature of a measurement target point is found.

The measured temperature data is provided as a digital signal from the control signal processing circuit 53 that is an MCU (microcontroller). The resistance value output circuit 54 outputs an analog signal. The analog signal enables the temperature detected by the sensors (thermistors) to be displayed on the monitor 8.

Figure 9:
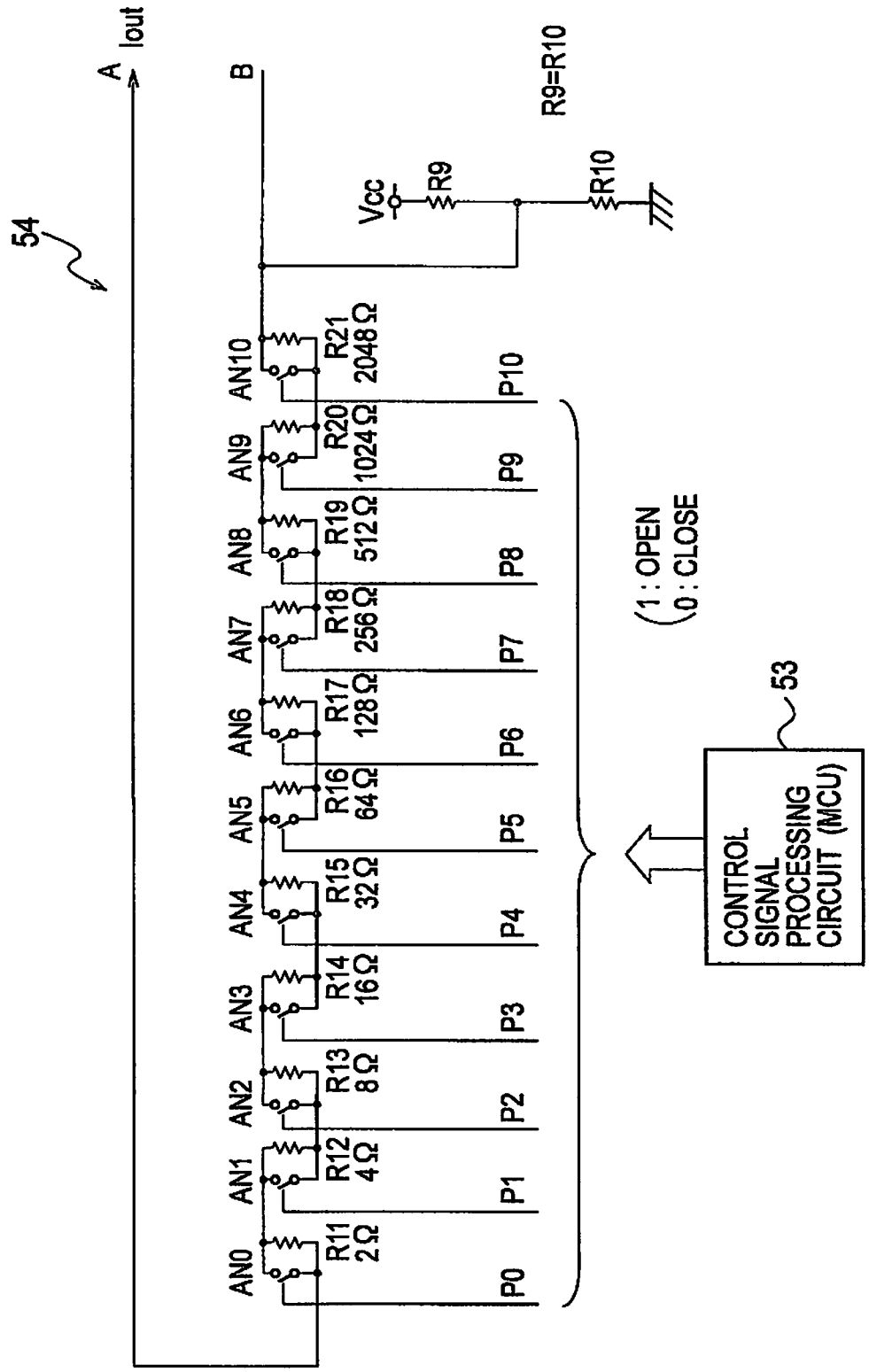
FIG. 9 A circuit diagram of a resistance value output circuit in the ear thermometer of the embodiment.

An analog signal representative of a measured temperature corresponding resistance value is converted by the control signal processing circuit 53 into a digital signal, which is supplied to the resistance value output circuit 54. The resistance value output circuit 54 is an 11-bit analog-digital conversion circuit having a configuration illustrated in FIG. 9 and converts the digital signal representative of a temperature value into an analog resistance value. Namely, ports P0 to P10 of the control signal processing circuit 53 output a digital signal of eleven digits of ONs and OFFs. In response to the digits, analog switches AN0 to AN10 of digit bits open (OFF) if 1 (HIGH) and close (ON) if 0 (LOW). As a result, a serial composition resistance value of resistors Ri of the bits whose analog switches ANI are opened is converted into a resistance value Rout that corresponds to the digital signal representative of the temperature value. Between terminals A and B of the resistance value output circuit 54, a bias voltage of one half of Vcc, i.e., 1.5 Vcc is applied. Accordingly, between the terminals A and B, a current Iout (=Vcc/2Rout) corresponding to the resistance value Rout is outputted. The monitor 8 considers the current Iout as a current passing through the thermistor, finds a resistance value corresponding to the current, converts the resistance value into a temperature, and displays the temperature.

The measuring apparatus 5 is intended to continuously measure the temperature of the object person for a long period of time according to a sequence of operations of (a) calibration, (2) measurement of the first sensor 25, (3) measurement of the second sensor 26, (4) calculation of a measured temperature, and (5) output of temperature data. The operations (1) to (5) are continuously repeated.

With this, according to the ear thermometer of the embodiment, the sensors (thermistors) used for the probe must keep an accuracy only for a temperature range in which the temperature of an object person varies. Unlike the conventional ear thermometer employing a thermopile, it is not necessary for securing a thermistor measurement accuracy for an entire range of ambient temperatures. Under a relatively stable ambient temperature, the embodiment can continuously measure temperatures for a long period of time. The sensors are soldered to the circuit conductor of the flexible printed circuit board in advance, to simplify assembling work. This is advantageous for mass production. In addition, the temperature measuring circuit is simple, the temperature calibration is simple, and the probe is miniaturized, to reduce the size and cost of the ear thermometer.

Next, with reference to FIGS. 10 to 12, a mode switching circuit 500 for the microcontroller MCU serving as the control signal processing circuit 53 incorporated in the measuring apparatus 5 will be explained.

Figure 10:
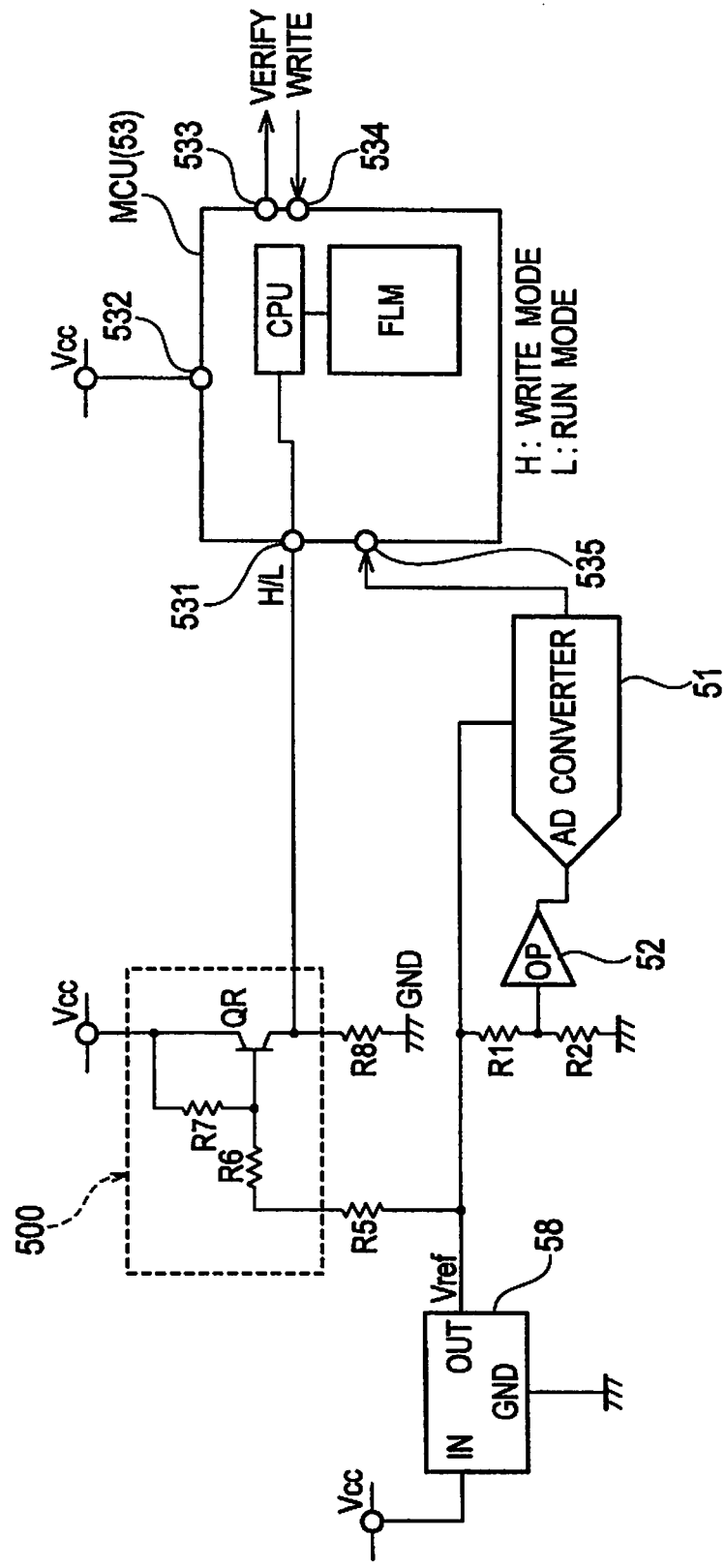
FIG. 10 A circuit block diagram of a mode switching function part of an MCU in a measuring apparatus for the ear thermometer of the embodiment.

As illustrated in FIG. 10, the microcontroller MCU has many input/output ports. Here, only ports related to program writing (including new writing and overwriting) to a built-in flash memory FLM are illustrated. The MCU includes a test port 531, a common voltage input port 532, a verify signal port 533, a program write port 534, and a temperature signal input port 535 and incorporates a central processing unit CPU and the flash memory FLM.

For this MCU, the mode switching circuit 500 is externally arranged. The mode switching circuit 500 receives a common voltage Vcc from the common voltage line and has a transistor QR that becomes conductive if the common voltage Vcc is higher than a predetermined voltage of 4 V and nonconductive if it is lower than that. The mode switching circuit 500 also has base bias resistors R5 to R7. A collector end of the transistor QR is connected to the test port 531 of the MCU and is also connected through a resistor R8 to the ground GND.

The bias resistor R5 of the mode switching circuit 500 receives the common voltage Vcc and is connected to an output line of a regulator 58 that provides the AD converter 51 with the predetermined voltage Vref. A current passing through the bias resistor R5 is joined with an output current of the regulator 58. As explained with reference to FIG. 2, the AD converter 51 converts a resistance value analog signal corresponding to a temperature detected signal of the temperature measuring probe 2 into a digital signal and supplies the digital signal to the temperature signal port 535 of the microcontroller MCU.

The reference voltage Vref for the AD converter 51 is 2.2 V. The regulator 58 applies the voltage Vref of 2.2 V to the AD converter 51. The common voltage line Vcc is 5 V. The resistors are R8=30 KΩ, R6=R7=100 KΩ, and R5=90 to 95 KΩ. With these values, the transistor QR turns on (conductive) if Vcc is higher than 4 V and turns off (nonconductive) if Vcc is lower than 4 V. Namely, if the voltage Vcc of the common voltage line is 5 V, the test port 531 of the microcontroller MCU receives a HIGH voltage, to shift the MCU to a program write mode. On the other hand, if the voltage Vcc of the common voltage line is 3 V, the test port 531 of the microcontroller MCU receives a LOW voltage to put the MCU in a normal run mode.

Figure 11:
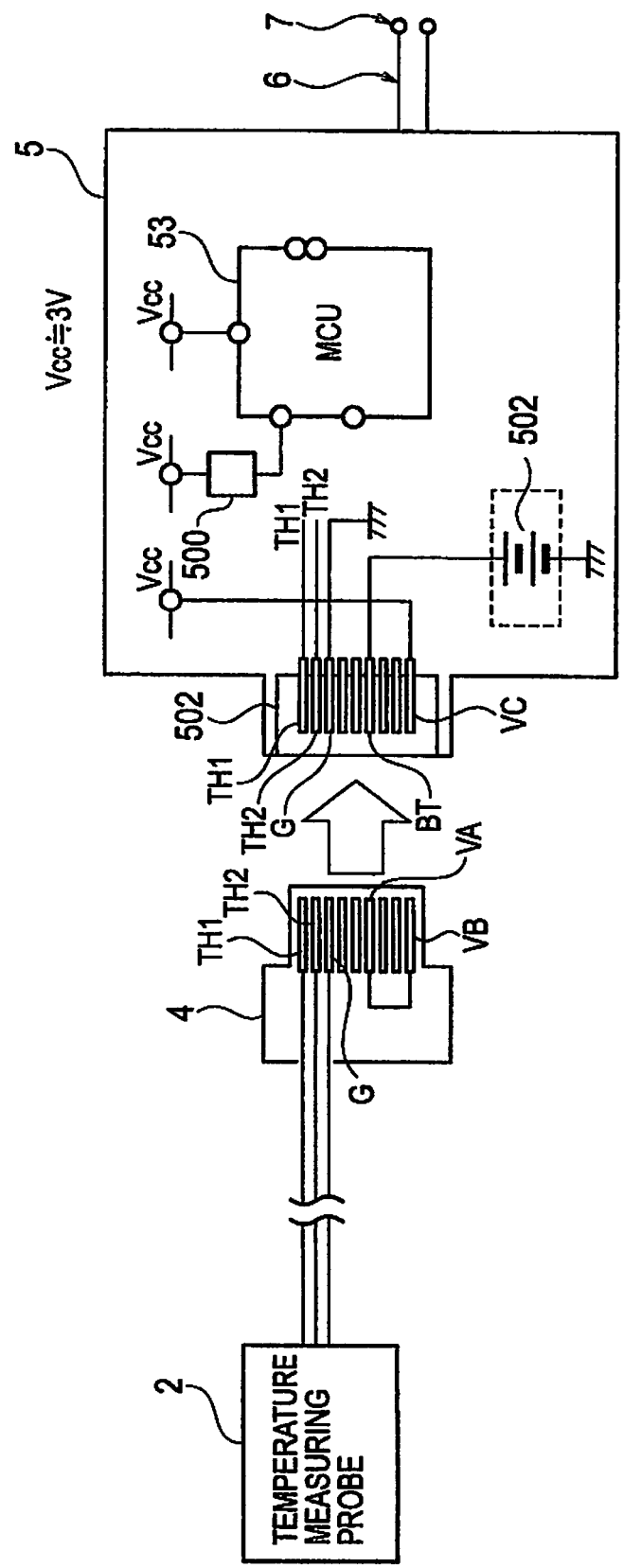
FIG. 11 An explanatory view of connector connection between the measuring apparatus and the probe for the ear thermometer of the embodiment.
Figure 12:
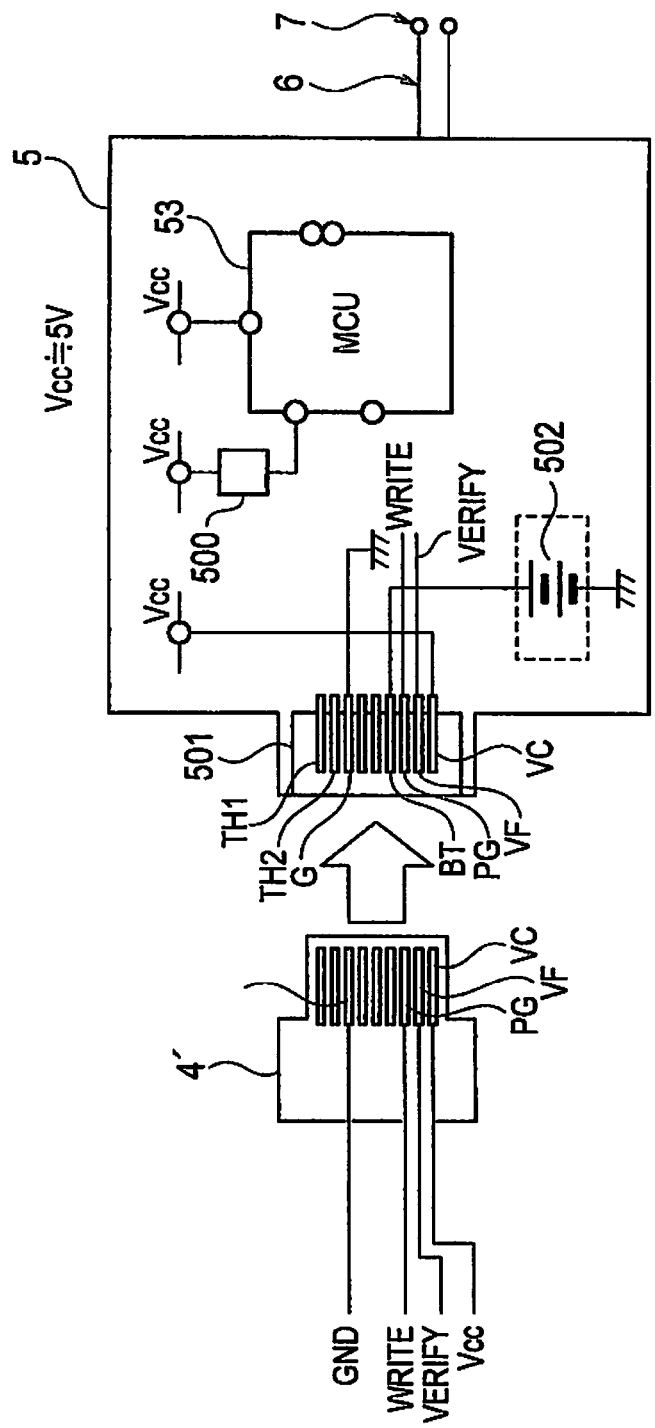
FIG. 12 An explanatory view of connector connection between the measuring apparatus and a program write unit for the ear thermometer of the embodiment.

As illustrated in FIGS. 11 and 12, the connector 501 of the measuring apparatus 5 is provided with terminals GND, TH1, and TH2 connected to the ground terminal GND and thermistor signal terminals TH1 and TH2 of the male connector 4 of the temperature measuring probe 2, respectively, a battery power source terminal BT connected to the built-in battery 502, a common voltage terminal VC connected to the internal common voltage line Vcc and a common voltage terminal VC of a write unit connector 4' of the program write unit, a program write terminal PG to receive write data from the write unit connector 4', and a verify signal terminal VF to output a verify signal.

As illustrated in FIG. 11, on the male connector 4 of the temperature measuring probe 2, terminals VA and VB connected to the battery power source terminal BT and common voltage terminal VC of the apparatus connector 501 are short-circuited. As a result, when the male connector 4 is inserted into and connected to the apparatus connector 501, the battery power source terminal BT and common voltage terminal VC are connected to each other through the terminals VA and VB of the male connector 4, to apply a battery voltage (normally, about 3 V) to the common voltage line Vcc in the measuring apparatus 5, thereby activating the measuring apparatus 5 to use the ear thermometer 1.

On the other hand, as illustrated in FIG. 12, the program write unit is prepared to write an initial program into the microcontroller MCU, or a firmware upgrade program into the flash memory FLM. When the write unit connector 4' is inserted into and connected to the apparatus connector 501, the common voltage terminal VC of a high common voltage Vcc of 5 V, program write terminal PG, verify signal terminal VF, and ground terminal G of the unit are connected to the common voltage terminal VC, program write terminal PG, verify signal terminal VF, and ground terminal G of the apparatus connector 501, respectively. As a result, the high voltage of 5 V necessary for writing a program to the MCU is applied from the program write unit to the common voltage line Vcc through the common voltage terminals VC.

Next, the mode switching circuit 500 and a mode switching operation of the microcontroller MCU will be explained.

[Program Write Mode]

If a requirement arises to write a program for operating the ear thermometer of the embodiment into the flash memory FLM in the MCU, or update the program, the program write unit illustrated in FIG. 12 is prepared and the connector 4' of the write unit is connected to the apparatus connector 501. As a result, the common voltage terminal VC of 5 V, program write terminal PG, verify signal terminal VF, and grand terminal G of the program write unit connector 4' are connected to the common voltage terminal VC, program write terminal PG, verify signal terminal VF, and grand terminal G of the apparatus connector 501, respectively. Then, the common voltage terminals VCs pass the high voltage of 5 V necessary for writing a program to the MCU from the program write unit to the common voltage line Vcc. With this, the MCU shifts to the program write mode, i.e., a flash mode as mentioned below.

The connection of the program write unit sets the voltage Vcc of the common voltage line to the high voltage of 5 V. This puts the transistor QR in a conductive state and the voltage of the test port 531 becomes HIGH. Accordingly, the MCU shifts to the flash mode and the CPU writes data from the program write port 534 into the flash memory FLM and outputs a verify signal from the verify signal port 533 to the program write unit.

[Run Mode]

On completion of the program writing or updating, the program write unit is removed and the male connector 4 of the temperature measuring probe 2 is connected to the apparatus connector 501 as illustrated in FIG. 11. Then, the microcontroller MCU shifts to the run mode to start a temperature measuring operation as mentioned below.

When the male connector 4 of the temperature measuring probe 2 is connected to the apparatus connector 501, the terminals VA and VB of the male connector 4 connect the battery power source terminal BT and common voltage terminal VC of the apparatus connector 501 of the apparatus 5 to each other, to apply the battery voltage (normally, about 3 V) to the common voltage line Vcc in the measuring apparatus 5. The mode switching circuit 500 puts the transistor QR in a nonconductive state as mentioned below, to bring the voltage applied to the test port 531 of the microcontroller MCU to LOW, switch the MCU to the normal operating state, i.e., the run mode, activate the measuring apparatus 5, and enable the ear thermometer 1.

When the battery 502 applies the common voltage Vcc=3 V, a voltage difference between the common voltage Vcc and the output voltage of the regulator 58, i.e., the reference voltage Vref=2.2 V is 0.8 V. An emitter-base open voltage of the transistor QR is −0.28 V and an ON voltage of the base of the transistor QR is −0.6 V. Accordingly, the transistor QR turns off and the voltage of the test port 531 becomes LOW 0 V. Then, the MCU determines that it is the run mode and shifts to the run mode to execute the program written in the flash memory FLM.

In this run mode, a current passed to the resistor R8 is about 6 μA, which is a very small current. The current passed to the resistor R8 is combined with a current from the regulator 58 and the combined current is supplied to the AD converter 51. Accordingly, a current supplied from the common voltage line Vcc to the regulator 58 is decreased by a portion that is equal to the current passed to the resistor R8. Namely, according to the mode switching circuit 500 of the embodiment, a current consumed by adding the circuit in question is substantially zero.

As mentioned above, the addition of the mode switching circuit 500 of the embodiment needs no mode switch that is usually needed to switch a mode of the MCU to another, simplifies a circuit configuration, suppresses a cost increase and a circuit area increase, and promotes the miniaturization of the measuring apparatus 5. In addition, the addition of the mode switching circuit 500 substantially involves no increase in current consumption, and therefore, reduces the consumption of the built-in battery 502.

The resistance values and transistor's characteristic values related to the embodiment are only examples, are not intended to restrict the present invention, and are modifiable depending on the use, size, scale, and other specifications of the apparatus.

Figure 13:
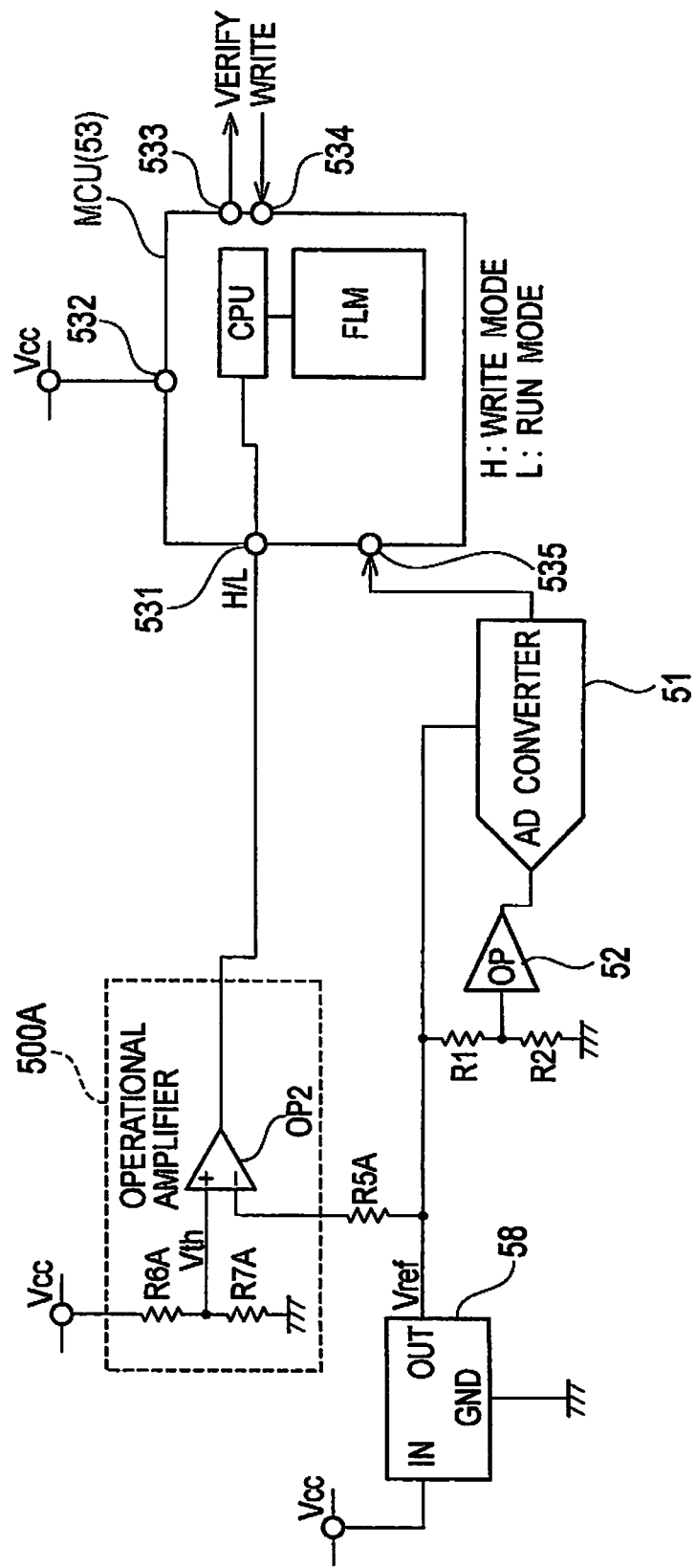
FIG. 13 A circuit block diagram of a mode switching function part including a mode switching circuit in a measuring apparatus according to a second embodiment of the present invention.
Figure 14:
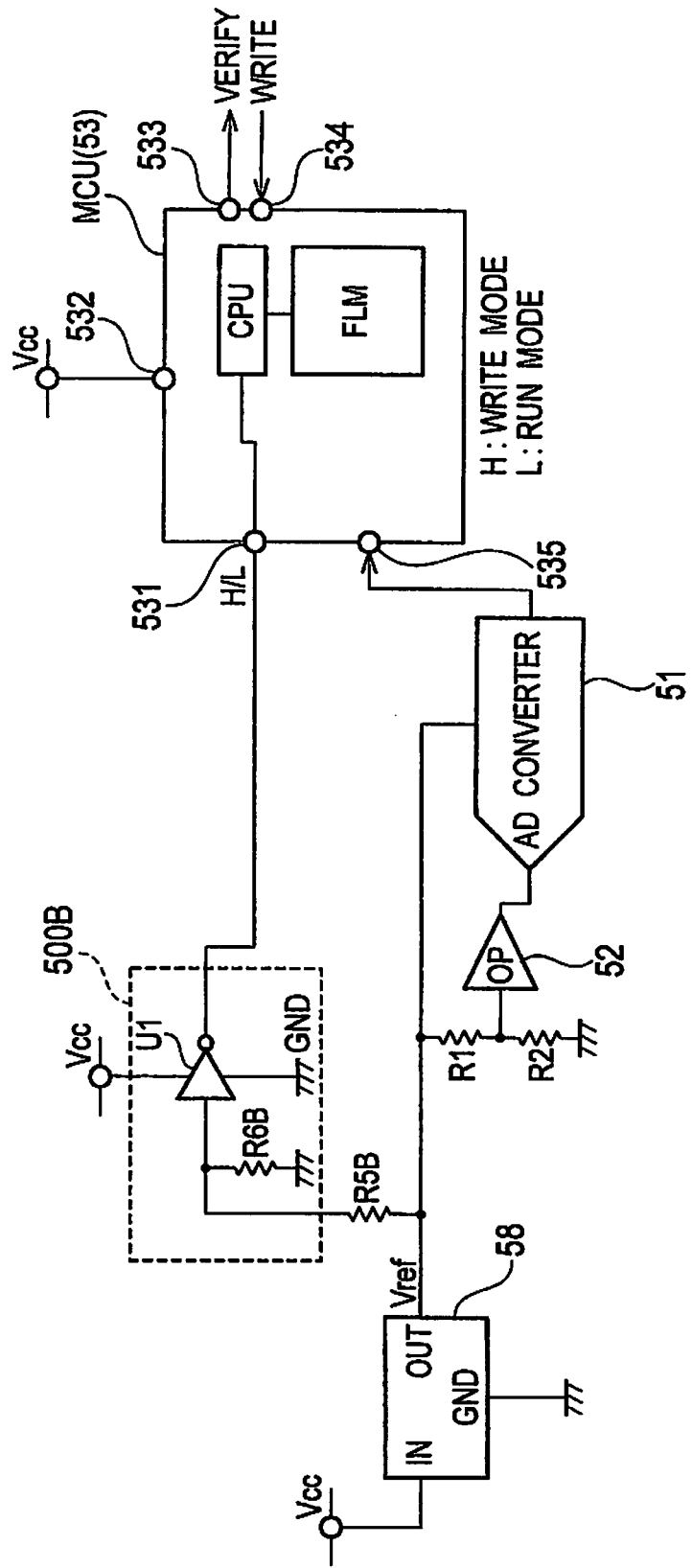
FIG. 14 A circuit block diagram of a mode switching function part including a mode switching circuit in a measuring apparatus according to a third embodiment of the present invention.
Figure 15:
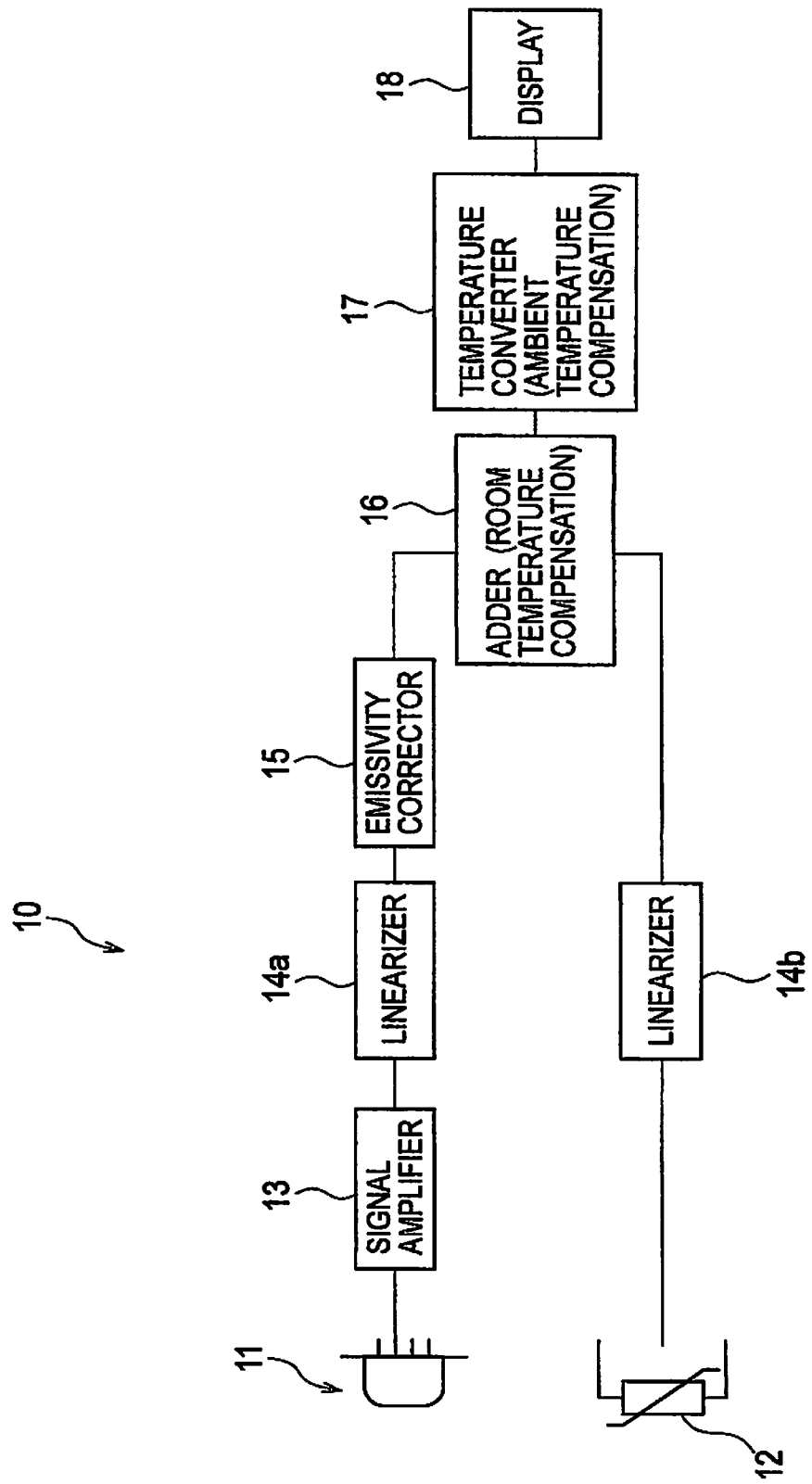
FIG. 15 A block diagram illustrating an operation principle of a conventional ear thermometer.
Figure 16:
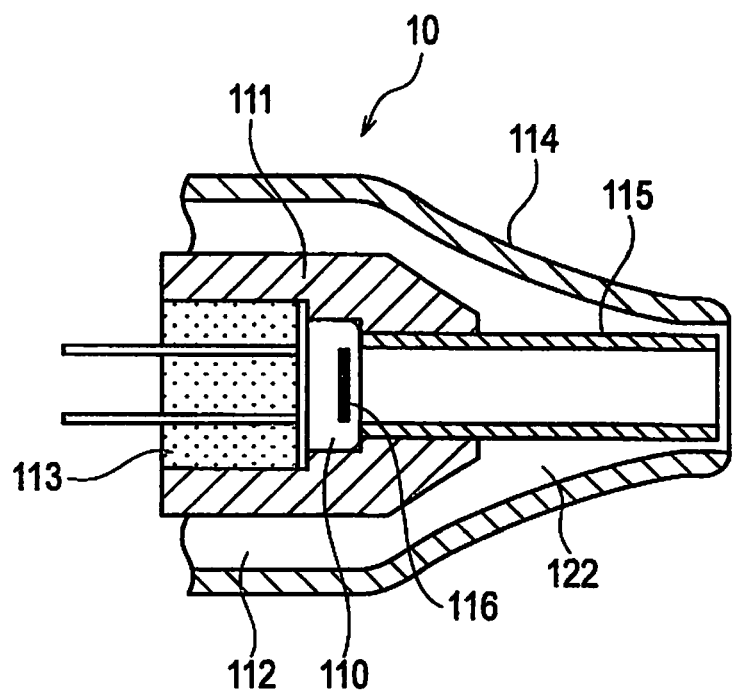
FIG. 16 A vertical sectional view of a temperature measuring part in the conventional ear thermometer.

The mode switching circuit 500 may be the one employing an operational amplifier OP2 illustrated in FIG. 13 (second embodiment) or the one employing a CMOS inverter U1 illustrated in FIG. 14 (third embodiment).

The mode switching circuit 500A illustrated in FIG. 13 will be explained. Between the common voltage line Vcc and the ground GND, resistors R6A and R7A are connected in series. A connection midpoint of the resistors R6A and R7A is connected to a plus input terminal of an operational amplifier OP2 operating as a comparator. A minus terminal of the operational amplifier OP2 is connected through a resistor R5A to the output line of the regulator 58. An output of the operational amplifier OP2 is connected to the test port 531 of the microcontroller MCU, so that the test port 531 may receive HIGH and LOW voltages that are switched from one to another. According to the mode switching circuit 500A, the regulator 58 outputs Vref=2.2 V and the operational amplifier OP2 switches at 4 V that is between the high voltage of 5 V from the program write unit and the low voltage of 3 V (normal voltage) from the built-in battery 502. When the program write unit is connected to set the common voltage Vcc=5 V, the operational amplifier OP2 inverts so that the common voltage Vcc is stepped down through the resistor R6A to Vth, which is supplied as the HIGH voltage to the test port 531 of the MCU, thereby shifting the MCU to the program write mode. On the contrary, when the connector 4 of the temperature measuring probe 2 is connected, the common voltage Vcc is set to the voltage of 3 V of the battery 502, to again invert the operational amplifier OP2. Then, the output Vref of the regulator 58 is stepped down through the resistor R5A and is supplied as the LOW voltage to the test port 531 of the MCU, thereby shifting the MCU to the normal operation mode, i.e., the run mode. The mode switching operation of the MCU is the same as that of the first embodiment mentioned above.

According to this embodiment, the resistors R6A and R7A are connected to the plus side of the operational amplifier OP2, and therefore, a very high impedance input is allowed. Due to this, the resistors R6A and R7A may be high resistance value elements. Then, like the first embodiment, substantially no current passes from the common voltage line to the ground when the operational amplifier OP2 performs no inverting operation. This suppresses consumption of the battery.

The mode switching circuit 500B illustrated in FIG. 14 will be explained. Between the common voltage line Vcc and the ground GND, a CMOS inverter U1 is arranged. A switching terminal thereof and the output of the regulator 58 are connected to each other through a resistor R5B. The switching terminal and the ground are connected to each other through a resistor R6B. The CMOS inverter U1 inverts an output in response to an input that is a half of a current detection voltage. Accordingly, the resistors R5B and R6B are so set that the switching terminal may receive a voltage of 2 V that is stepped down from the reference voltage Vref=2.2 V from the regulator 58. Then, when the common voltage Vcc exceeds 4 V, the common voltage Vcc is supplied as HIGH to the test port 531 of the microcontroller MCU, and when the common voltage Vcc drops below 4 V, it is inverted to the LOW voltage which is supplied to the test port 531 of the MCU.

When the program write unit is connected to set the common voltage Vcc=5 V, the CMOS inverter U1 of the mode switching circuit 500B inverts to supply the common voltage Vcc as the HIGH voltage to the test port 531 of the MCU, thereby shifting the MCU to the program write mode. When the connector 4 of the temperature measuring probe 2 is connected to set the common voltage Vcc to the voltage of 3 V of the battery 502, the CMOS inverter U1 again inverts to supply the LOW voltage=0 to the test port 531 of the MCU, thereby shifting the MCU to the normal operation mode, i.e., the run mode. The mode switching operation of the MCU is the same as that of the first embodiment.

This embodiment can also adopt a high resistance element as the resistor R6B. Like the first embodiment, substantially no current passes from the common voltage line to the ground when the CMOS inverter U1 is in a state not to invert. This suppresses consumption of the battery.

INDUSTRIAL APPLICABILITY

The ear thermometer of the present invention is applicable not only to humans but also to animals.

The invention claimed is:

1. A measuring apparatus for an ear thermometer comprising:
   a common voltage line;
   a built-in battery serving as a power source;
   a connector to receive a connector of a probe, having a common voltage terminal connected to the common voltage line;
   a flash-type microcontroller to control a temperature sensor of the probe, receive a resistance value output signal corresponding to a measured temperature from the temperature sensor, convert the signal into a digital temperature value, and output the digital temperature value, the microcontroller having a test port, a program write port, and a common voltage port connected to the common voltage line, establishing a flash mode when a HIGH voltage higher than a first predetermined voltage is applied to the test port, to enable a program to be written through the write port, and establishing a run mode when a LOW voltage lower than the first predetermined voltage is applied to the test port;
   a voltage regulator having an input side connected to the common voltage line, to provide a constant reference voltage; and
   a mode switching circuit connected to the common voltage line, to apply the HIGH voltage to the test port of the microcontroller when a common voltage is higher than a second predetermined voltage, apply the LOW voltage to the test port of the microcontroller when the common voltage is lower than the second predetermined voltage, and bypass a leakage current passing from the common voltage line to the mode switching circuit toward an output of the voltage regulator so as to combine them together,
   the connector having the common voltage terminal, a battery power source terminal connected to the built-in battery, a program write terminal connected to the write port of the microcontroller, and a sensor connection terminal to receive the resistance value output signal corresponding to a measured temperature from the temperature sensor of the probe.

2. The measuring apparatus for an ear thermometer as set forth in claim 1, characterized in that the mode switching circuit consists of a pnp-type transistor having an emitter connected to the common voltage line, a collector connected to the test port, and a base connected through a bias resistor to the common voltage line, a first resistor interposed between the collector and the ground, to set a voltage of the collector as the HIGH voltage when the transistor is in a conductive state, and a second resistor interposed between the base of the transistor and the output of the regulator.

3. The measuring apparatus for an ear thermometer as set forth in claim 1, characterized in that:
   the mode switching circuit is constituted by connecting two resistors in series between the common voltage line and the ground, connecting a plus input terminal of an operational amplifier operating as a comparator to a connection midpoint of the two resistors, connecting a minus terminal of the operational amplifier through another resistor to the output line of the regulator, and connecting an output terminal of the operational amplifier to the test port of the microcontroller; and
   when a voltage applied to the plus terminal of the operational amplifier is higher than an intermediate voltage between a battery voltage applied to the common voltage line and a program write voltage, the operational amplifier is put in a conductive state to output the common voltage of the common voltage line as the HIGH voltage to the test port, and when it is lower than the intermediate voltage, the operational amplifier is inverted into a nonconductive state.

4. The measuring apparatus for an ear thermometer as set forth in claim 1, characterized in that:
   the mode switching circuit is constituted by arranging a CMOS inverter between the common voltage line and the ground, connecting a switching terminal of the CMOS inverter and the output of the regulator to each other through a resistor, and connecting an output of the CMOS inverter to the test port; and
   when a voltage applied to the switching terminal of the CMOS inverter is higher than an intermediate voltage between a battery voltage applied to the common voltage line and a program write voltage, the common voltage of the common voltage line is outputted as the HIGH voltage to the test port, and when it is lower than the intermediate voltage, an output voltage from the regulator stepped down through the resistor is outputted as the LOW voltage to the test port.

5. The measuring apparatus for an ear thermometer as set forth in claim 1, characterized in that the connector is configured so that, when connected to the probe connector, the battery power source terminal and common voltage terminal are connected to each other through short-circuited two terminals of the probe connector, and when connected to a program write unit connector, the common voltage terminal is connected to a voltage terminal of the second predetermined voltage of the program write unit connector.

* * * * *